(12) United States Patent
Lu et al.

(10) Patent No.: US 11,837,566 B2
(45) Date of Patent: Dec. 5, 2023

(54) ELECTRONIC DEVICE PACKAGE AND METHOD FOR MANUFACTURING THE SAME

(71) Applicant: Advanced Semiconductor Engineering, Inc., Kaohsiung (TW)

(72) Inventors: Mei-Ju Lu, Kaohsiung (TW); Chi-Han Chen, Kaohsiung (TW); Chang-Yu Lin, Kaohsiung (TW); Jr-Wei Lin, Kaohsiung (TW); Chih-Pin Hung, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 38 days.

(21) Appl. No.: 17/534,358

(22) Filed: Nov. 23, 2021

(65) Prior Publication Data

US 2022/0084972 A1 Mar. 17, 2022

Related U.S. Application Data

(63) Continuation of application No. 16/673,699, filed on Nov. 4, 2019, now Pat. No. 11,183,474.

(51) Int. Cl.
*H01L 23/00* (2006.01)

(52) U.S. Cl.
CPC .............. *H01L 24/17* (2013.01); *H01L 24/05* (2013.01); *H01L 24/13* (2013.01); *H01L 24/16* (2013.01);

(Continued)

(58) Field of Classification Search
CPC ......... H01L 24/17; H01L 24/04; H01L 24/13; H01L 24/16; H01L 24/73; H01L 24/81;
(Continued)

(56) References Cited

U.S. PATENT DOCUMENTS 7,592,202 B2 * 9/2009 Toyama .................. H01L 23/66
257/E21.503
8,791,536 B2 * 7/2014 Kinsman ............. H01L 27/1469
257/432

(Continued)

OTHER PUBLICATIONS

Non-Final Office Action for U.S. Appl. No. 16/673,699, dated Feb. 19, 2021, 17 pages.
U.S. Notice of Allowance for U.S. Appl. No. 16/673,699, dated Jul. 23, 2021, 5 pages.

*Primary Examiner* — Dao H Nguyen
(74) *Attorney, Agent, or Firm* — FOLEY & LARDNER LLP

(57) ABSTRACT

An electronic device package includes a circuit layer, a first semiconductor die, a second semiconductor die, a plurality of first conductive structures and a second conductive structure. The first semiconductor die is disposed on the circuit layer. The second semiconductor die is disposed on the first semiconductor die, and has an active surface toward the circuit layer. The first conductive structures are disposed between a first region of the second semiconductor die and the first semiconductor die, and electrically connecting the first semiconductor die to the second semiconductor die. The second conductive structure is disposed between a second region of the second semiconductor die and the circuit layer, and electrically connecting the circuit layer to the second semiconductor die.

16 Claims, 12 Drawing Sheets

(52) U.S. Cl.
CPC .............. *H01L 24/73* (2013.01); *H01L 24/81* (2013.01); *H01L 2224/02373* (2013.01); *H01L 2224/02375* (2013.01); *H01L 2224/02377* (2013.01); *H01L 2224/02381* (2013.01); *H01L 2224/13024* (2013.01); *H01L 2224/13082* (2013.01); *H01L 2224/16145* (2013.01); *H01L 2224/16225* (2013.01); *H01L 2224/1703* (2013.01); *H01L 2224/17177* (2013.01); *H01L 2224/73204* (2013.01); *H01L 2224/81951* (2013.01)

(58) Field of Classification Search
CPC . H01L 2224/02373; H01L 2224/02375; H01L 2224/02377; H01L 2224/02381; H01L 2224/13024; H01L 2224/13082; H01L 2224/16145; H01L 2224/16225; H01L 2224/1703; H01L 2224/17177; H01L 2224/73204; H01L 2224/81951
See application file for complete search history.

(56) References Cited

U.S. PATENT DOCUMENTS

| | | |
|---|---|---|
| 9,508,688 B2 | 11/2016 | Kim |
| 9,780,072 B2 | 10/2017 | Jeng et al. |
| 10,177,188 B2 * | 1/2019 | Kang ................ H01L 27/14621 |
| 10,256,196 B2 | 4/2019 | Ishido et al. |
| 11,183,474 B2 * | 11/2021 | Lu ........................ H01L 23/5389 |
| 2013/0056869 A1 | 3/2013 | Kuo et al. |
| 2013/0182402 A1 | 7/2013 | Chen et al. |
| 2014/0217610 A1 | 8/2014 | Jeng et al. |
| 2014/0353823 A1 | 12/2014 | Park et al. |
| 2015/0028472 A1 * | 1/2015 | Jung ................... H01L 25/0657 |
| | | 257/737 |
| 2016/0181218 A1 * | 6/2016 | Karhade ................. H01L 25/18 |
| | | 257/737 |
| 2017/0154913 A1 * | 6/2017 | Jun ......................... H01L 24/97 |
| 2019/0131241 A1 * | 5/2019 | Jeng ...................... H01L 25/105 |
| 2019/0238134 A1 | 8/2019 | Lee et al. |
| 2020/0321375 A1 * | 10/2020 | Wu ..................... H01L 27/1469 |

* cited by examiner

ELECTRONIC DEVICE PACKAGE AND METHOD FOR MANUFACTURING THE SAME

CROSS-REFERENCE TO RELATED APPLICATION

This application is a continuation of U.S. patent application Ser. No. 16/673,699 filed Nov. 4, 2019, the contents of which is incorporated herein by reference in its entirety.

BACKGROUND

1. Technical Field

The present disclosure relates to an electronic device package for high speed signal transmission.

2. Description of the Related Art

Chip-on-chip (CoC) package includes two electronic components stacked on each other. The stacked electronic components are in electrical communication with each other through wire bonding. The bond wires, however, have high resistance and long transmission path. Therefore, CoC package suffers from signal integrity, particularly in high frequency application. In addition, the constraint of comparative wire bonding signal transmission is that the high impedance caused by the extended transmission path prevents high speed data rate, for example, 100 Gbit/s, 400 Gbit/s, or 1.6 Tbit/s, from realization. In addition, silicon photonics and optical engine usually specify high speed data rate with the integration of at least an electronic IC (EIC) and a photonic IC (PIC).

SUMMARY

In some embodiments, an electronic device package includes a circuit layer, a first semiconductor die, a second semiconductor die, a plurality of first conductive structures and a second conductive structure. The circuit layer includes a first surface. The first semiconductor die is disposed on the circuit layer. The second semiconductor die is disposed on the first semiconductor die, and has an active surface toward the first surface. The first conductive structures are disposed between a first region of the second semiconductor die and the second semiconductor die, and electrically connecting the first semiconductor die to the second semiconductor die. The second conductive structure is disposed between a second region of the second semiconductor die and the circuit layer, and electrically connecting the circuit layer to the second semiconductor die.

In some embodiments, an electronic device package includes a circuit layer, a first semiconductor die, a second semiconductor die, a plurality of first conductive structures and a plurality of second conductive structures. The circuit layer includes a first surface. The first semiconductor die is disposed on the circuit layer. The second semiconductor die is disposed on the first semiconductor die and the circuit layer. The second semiconductor die includes a built-up redistribution trace layer facing the first semiconductor die. The first conductive structures are disposed between the second active surface and the first active surface, and bonding the first semiconductor die to the built-up redistribution trace layer of the second semiconductor die. The first conductive structures each includes a first conductive material adjacent to the first semiconductor die and a second conductive material adjacent to the second semiconductor die, and the second conductive material includes a first end toward the circuit layer. The second conductive structures are disposed between the second semiconductor die and the circuit layer, and electrically connecting the second semiconductor die to the circuit layer. The second conductive structures each includes a second end toward the circuit layer, and the first ends and the second ends are not leveled.

In some embodiments, a method of manufacturing an electronic device package includes following operations. A first semiconductor die is provided. A second semiconductor die with a redistribution trace layer exposed from an active surface of the second semiconductor die is provided. A plurality of second conductive structures are formed on a portion of the redistribution trace layer. The first semiconductor die is bonded to another portion of the redistribution trace layer of the second semiconductor die with a plurality of first conductive structures. An encapsulation layer is formed on the active surface of the second semiconductor die to encapsulate the first semiconductor die. A circuit layer is formed on the encapsulation layer to electrically connect the second semiconductor die with the plurality of second conductive structures.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
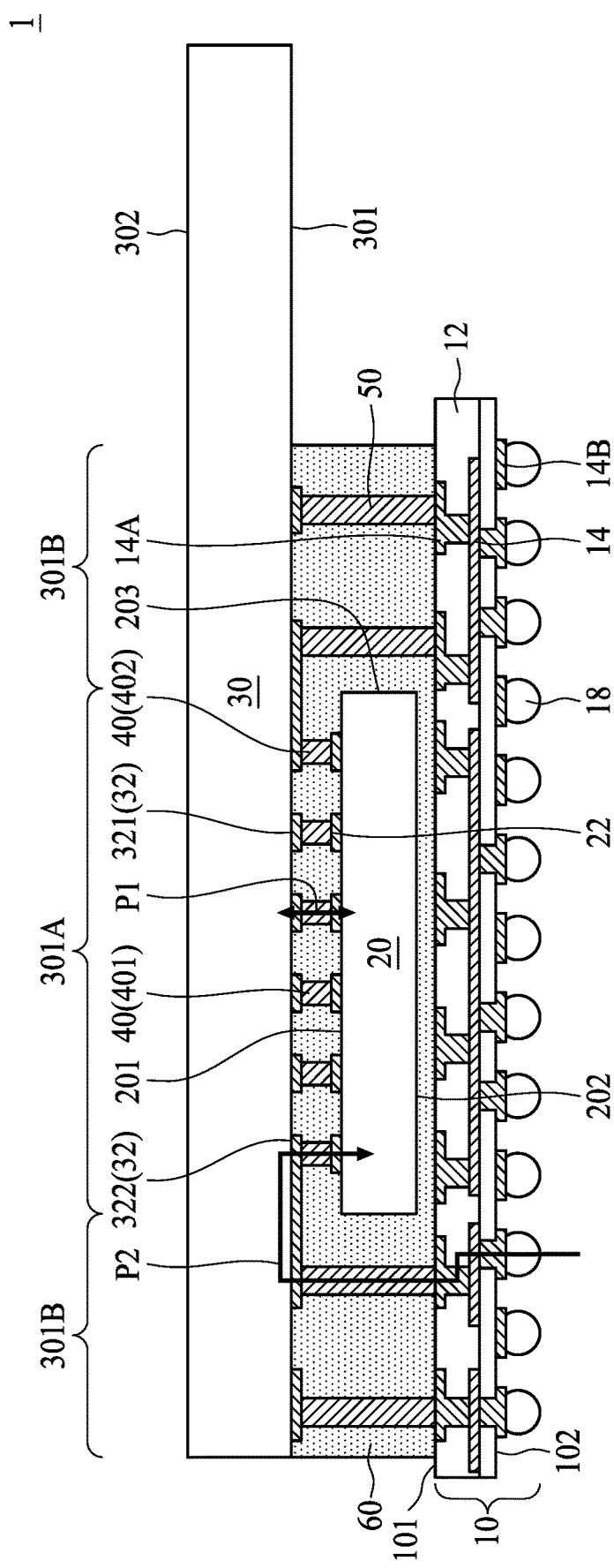
FIG. 1 is a cross-sectional view of an electronic device package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein the term "active surface" may refer to a surface of an electronic component on which contact terminals such as contact pads are disposed, and the term "inactive surface" may refer to another surface of the electronic component opposite to the active surface on which no contact terminals are disposed.

Present disclosure provides a fan-out package-on-package semiconductor package structure realizing high speed signal transmission, for example, greater than 400 Gbit/s. At least one of the electrical signals is first sent to an electronic IC (EIC) for amplification, and then arriving at a photonic IC (PIC). For example, EIC may include both active semiconductor devices and passive circuit components and the electrically conductive paths interconnecting the active semiconductor devices and passive circuit components in electrical circuit relationships for performing a desired sub-circuit control function. PIC may include a combination of photonic devices in a circuit on a single substrate to achieve a desired function. For example, PIC may include lasers, receivers, waveguides, detectors, semiconductor optical amplifiers (SOA), gratings, and other active and passive semiconductor optical devices on a single substrate. The signal transmission path is designed in the package to have suitable impedance allowing the aforesaid high speed signal transmission. In some embodiments, high speed signal, for example, may possess a data rate of about 100 Gbit/s, 400 Gbit/s, or 1.6 Tbit/s.

Figure 1A:
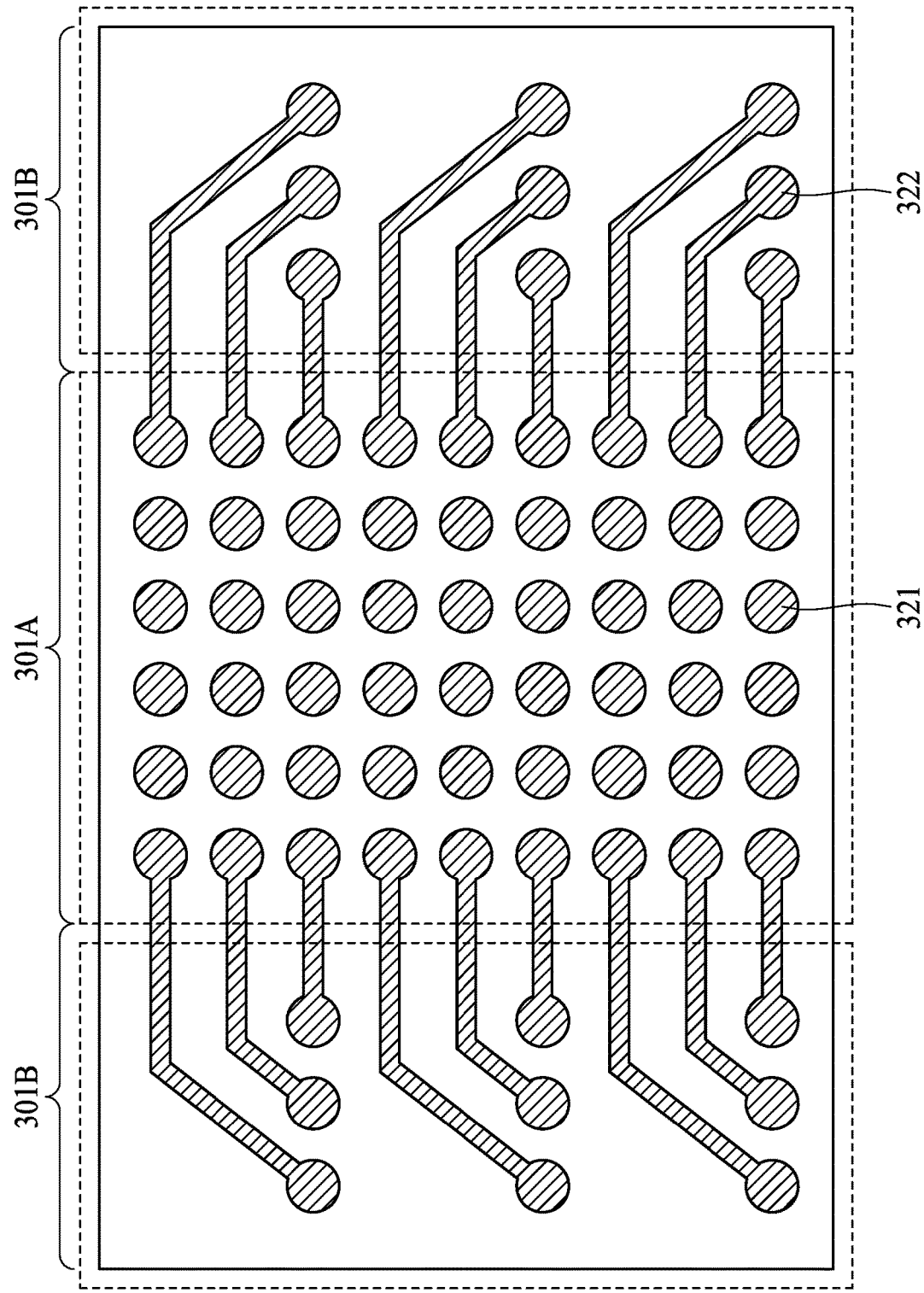
FIG. 1A is a bottom view of a second semiconductor die in accordance with some embodiments of the present disclosure.
Figure 1B:
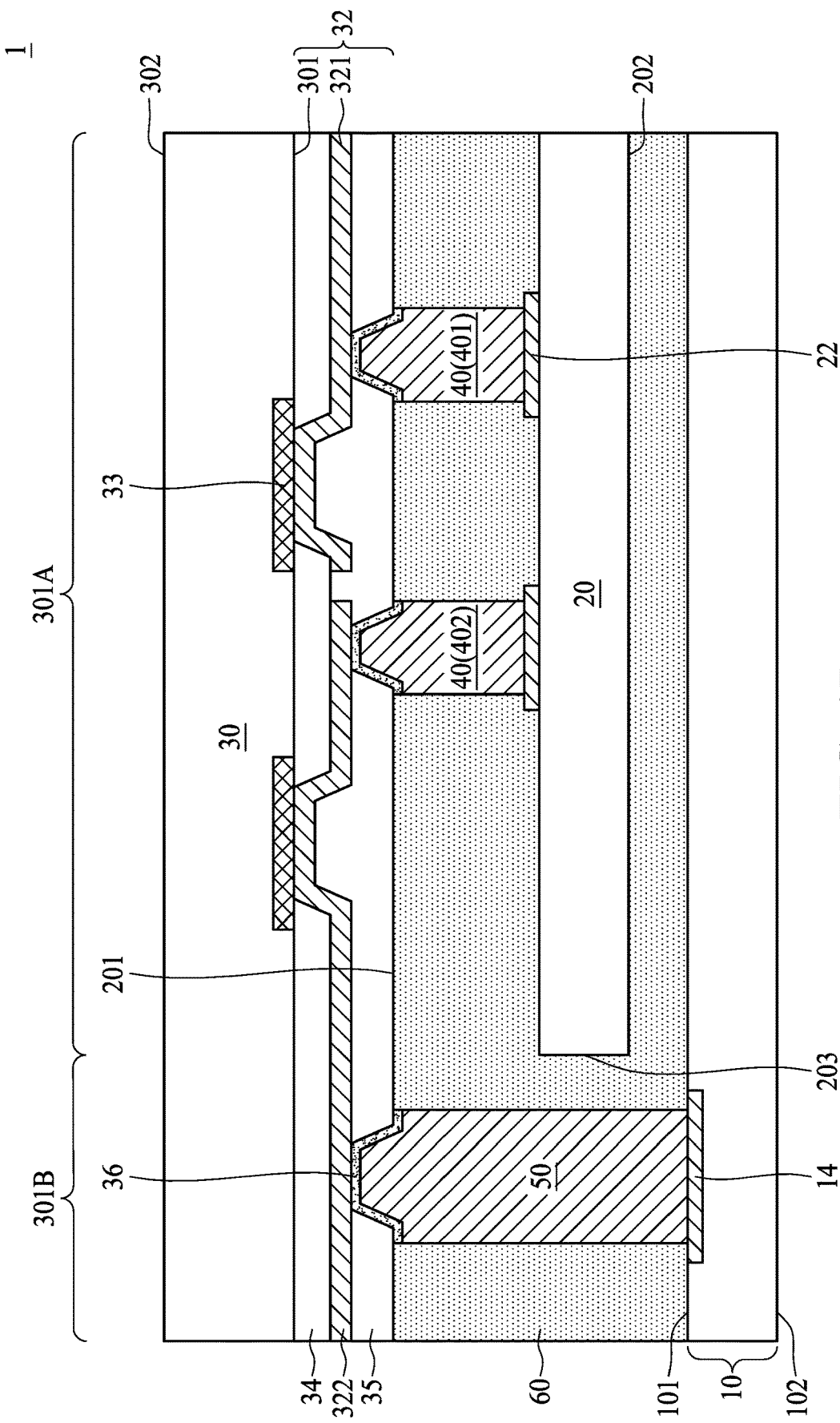
FIG. 1B is an enlarged partial cross-sectional view of an electronic device package in accordance with some embodiments of the present disclosure.

FIG. 1 is a cross-sectional view of an electronic device package 1 in accordance with some embodiments of the present disclosure, FIG. 1A is a bottom view of a second semiconductor die 30 in accordance with some embodiments of the present disclosure, and FIG. 1B is an enlarged partial cross-sectional view of an electronic device package 1 in accordance with some embodiments of the present disclosure. As shown in FIGS. 1, 1A and 1B, the electronic device package 1 includes a circuit layer 10, a first semiconductor die 20, a second semiconductor die 30, a plurality of first conductive structures 40 and an encapsulation layer 60. The circuit layer 10 includes a first surface (e.g., an upper surface) 101, and a second surface (e.g., a lower surface) 102. The circuit layer 10 may include one or more insulative layers 12, and one or more conductive wiring layers 14 stacked on one another. The material of the insulative layer(s) 12 may include organic insulative material such as epoxy resin, bismaleimide-triazine (BT) resin, inorganic insulative material such as silicon oxide, silicon nitride, or a combination thereof. The material of the conductive wiring(s) 14 may include metal such as copper (Cu) or the like. The conductive wirings 14 may include first electrical terminals 14A such as bonding pads exposed from the first surface 101 to connect the first semiconductor die 20 and the second semiconductor die 30, and second electrical terminals 14B such as bonding pads exposed from the second surface 102 to connect an external component such as a printed circuit board (PCB).

The circuit layer 10 may include a bumping-level circuit layer or a substrate-level circuit layer. By way of example, the L/S of the circuit layer 10 may be between about 2 µm/about 2 µm and about 10 µm/about 10 µm or wider than about 10 µm/about 10 The bumping-level circuit layer may be patterned and defined by e.g., photolithography-plating-etching technique. The substrate-level circuit layer may be patterned and defined by e.g., laser drill-plating-etching techniques.

The first semiconductor die 20 is disposed on the circuit layer 10. The first semiconductor die 20 includes a first active surface 201, and a first inactive surface 202 opposite to the first active surface 201 and toward the first surface 101. The first semiconductor die 20 may include electrical terminals 22 such as bonding pads exposed from the first active surface 201. The second semiconductor die 30 is disposed on the first semiconductor die 20. The second semiconductor die 30 includes a second active surface 301 toward the first active surface 201 of the first semiconductor die 20, and a second inactive surface 302 opposite to the second active surface 301. In some embodiments, the first semiconductor die 20 may include an electronic IC, and the second semiconductor die 30 may include a photonic IC.

The second semiconductor die 30 may include a redistribution trace layer 32 exposed from the second active surface 301. The redistribution trace layer 32 may be a built-up redistribution layer, which is formed and built up on the second semiconductor die 30 instead of being formed in advance and attached to the second semiconductor die 30. In some embodiments, the redistribution trace layer 32 may include a plurality of first conductive traces 321 disposed in the first region 301A, and a plurality of second conductive traces 322 extending from the first region 301A to a second region 301B not overlapping the first semiconductor die 20. The redistribution trace layer 32 may be configured as a fan-out structure with respect to the first semiconductor die 20, in which a projected area of the first conductive traces 321 and the second conductive traces 322 may be greater than and exceeding a projected area of the first semiconductor die 10. The first conductive traces 321 and the second conductive traces 322 may belong to the same patterned conductive material, which may include metal such as copper (Cu) or the like. In some embodiments, the first region 301A may be a high density region, while the second region 301B may be a low density region. The high density region may possess a greater number of electrical terminals per area than the low density region.

As shown in FIG. 1B, the redistribution trace layer 32 may further include a plurality of electrical terminals 33 such as bonding pads, and a first insulation layer 34 at least partially exposing the electrical terminals 33. The first conductive traces 321 and the second conductive traces 322 may be disposed on the first insulation layer 34 and electrically connected to the exposed electrical terminals 33. In some embodiments, the redistribution trace layer 32 may further include a second insulation layer 35 disposed on the first insulation layer 34 and at least partially exposing the first conductive traces 321 and the second conductive traces 322. In some embodiments, the redistribution trace layer 32 may further includes seed layers 36 disposed on and electrically connected to the exposed first conductive traces 321 or the exposed second conductive traces 322. The material of the first insulation layer 34 and the second insulation layer 35 each may include organic insulative material such as epoxy resin, bismaleimide-triazine (BT) resin, inorganic insulative material such as silicon oxide, silicon nitride, or a combination thereof. The material of the conductive electrical terminals 33 may include metal such as copper (Cu), aluminum (Al) or the like.

In some embodiments, the first semiconductor die 20 is die-to-died bonded to the second semiconductor die 30. By way of example, the first active surface 201 of the first semiconductor die 20 faces the second active surface 301 of the second semiconductor die 30, and the first conductive structures 40 are disposed between a first region 301A of the second active surface 301 of the second semiconductor die 30 and the first active surface 201. In some embodiments, the first conductive structures 40 are solder-free joints including solder-free conductive structures. By way of examples, the first conductive structures 40 may include conductive pillars such as copper pillars. In some embodiments, the first conductive structures 40 may be formed on the seed layer 36 by e.g., electroplating prior to bonding to the first semiconductor die 20.

The encapsulation layer 60 is disposed between the circuit layer 10 and the second semiconductor die 30, and encapsulates the first semiconductor die 20 and at least a portion of the second active surface 301 of the second semiconductor die 30. The encapsulation layer 60 may include molding compounds such epoxy resin, and fillers such as silicon oxide fillers may be filled in the molding compound. In some embodiments, the encapsulation layer 60 may encapsulate the first active surface 201 and lateral surfaces 203 of the first semiconductor die 20. The encapsulation layer 60 may further encapsulate the first inactive surface 202 of the first semiconductor die 20.

The electronic device package 1 may further include a plurality of second conductive structures 50 disposed between the second region 301B of the second active surface 301 of the second semiconductor die 30 and the first surface 101 of the circuit layer 10, and electrically connecting the second semiconductor die 30 to the circuit layer 10. The second conductive structure 50 is taller than the first conductive structure 40. In some embodiments, the second conductive structures 50 are solder-free joints including solder-free conductive structures. By way of examples, the second conductive structures 50 may include conductive pillars such as copper pillars. In some embodiments, the second conductive structures 50 may be formed on the seed layer 36 by e.g., electroplating prior to bonding to the circuit layer 10.

In some embodiments, the first conductive structures 40 may be grouped into two sets. A first set 401 of the first conductive structures 40 is electrically connected to the first conductive traces 321 and the first semiconductor die 20, and electrically connecting the first semiconductor die 20 to the second semiconductor die 30. A first electrical connection path P1 is established among the first semiconductor die 20, the first set 401 of the first conductive structures 40, the first conductive traces 321 and the second semiconductor die 30. The die-to-die bonding using the first set 401 of the first conductive structures 40 can shorten the transmission path between the first semiconductor die 20 and the second semiconductor die 30. A second set 402 of the first conductive structures 40 is electrically connected to the second conductive traces 322 and the first semiconductor die 20, and the second conductive structures 50 are electrically connected to the circuit layer 10 and the second conductive traces 322. A second electrical connection path P2 is established among the first semiconductor die 20, the second set 402 of the first conductive structures 40, the second conductive traces 321, the second semiconductor die 30, the second conductive structures 50 and the circuit layer 10. The second set 402 of the first conductive structures 40 and the second conductive structures 50 can shorten the transmission path between the circuit layer 10 and the second semiconductor die 30.

In some embodiments, the electronic device package 1 may further include a plurality of electrical conductors 18 disposed on the second surface 102 of the circuit layer 10, and electrically connected to the circuit layer 10. The electrical conductors 18 may include solder balls or solder bumps such as C4 bumps for connecting to an external component such as PCB.

The electronic device package 1 may be a chip-on-chip (CoC) package including the first semiconductor die 20 on the circuit layer 10, and the second semiconductor die 30 stacked on the first semiconductor die 30. The electrical connections between the first semiconductor die 20 and the second semiconductor die 30 and between the second semiconductor die 30 and the circuit layer 10 are implemented by conductive structures 40 and/or 50 such as conductive pillars. The conductive pillars is lower in resistance compared to bonding wires, and the conductive structures 40 and/or 50 can also shorten the transmission path among the circuit layer 10, the first semiconductor die 20 and the second semiconductor die 30. Accordingly, induction effect and signal integrity issue can be alleviated, particularly in high frequency application.

The electronic device packages and manufacturing methods of the present disclosure are not limited to the above-described embodiments, and may be implemented according to other embodiments. To streamline the description and for the convenience of comparison between various embodiments of the present disclosure, similar components the following embodiments are marked with same numerals, and may not be redundantly described.

Figure 2A:
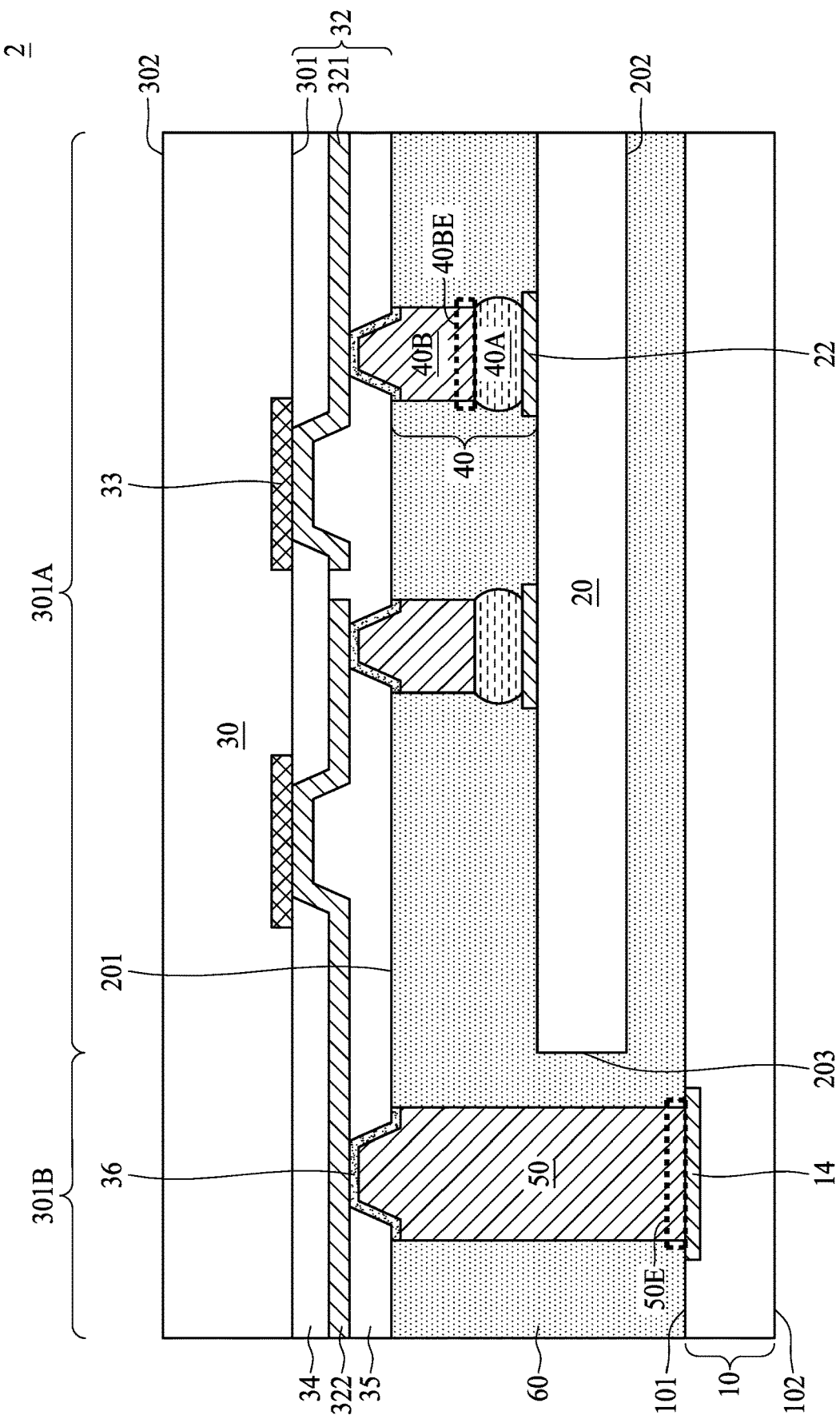
FIG. 2A is a cross-sectional view of an electronic device package in accordance with some embodiments of the present disclosure.

FIG. 2A is a cross-sectional view of an electronic device package 2 in accordance with some embodiments of the present disclosure. As shown in FIG. 2A, in contrast to the electronic device package 1 in FIG. 1, the first conductive structure 40 includes a stack of a first conductive material 40A adjacent to the first semiconductor die 20 and a second conductive material 40B adjacent to the second semiconductor die 30. In some embodiments, the second conductive material 40B may include a conductive pillar pre-formed on the seed layer 36, and bonded to the electrical terminal 22 of the first semiconductor die 20 with the first conductive material 40A such as a conductive solder. In some embodiments, the second conductive material 40B includes a first end 40BE toward the circuit layer 10. In some embodiments, the second conductive structure 50 may include a conductive pillar. The second conductive structure 50 includes a second end 50E toward the circuit layer 10. The first end 40BE and the second end 50E are not leveled, e.g., the first end 40BE and the second end 50E are not disposed at the same horizontal level. By way of example, the second end 50E is lower than the first end 40BE, e.g., the second end 50E is closer to the circuit layer 10 than the first end 40BE.

Figure 2B:
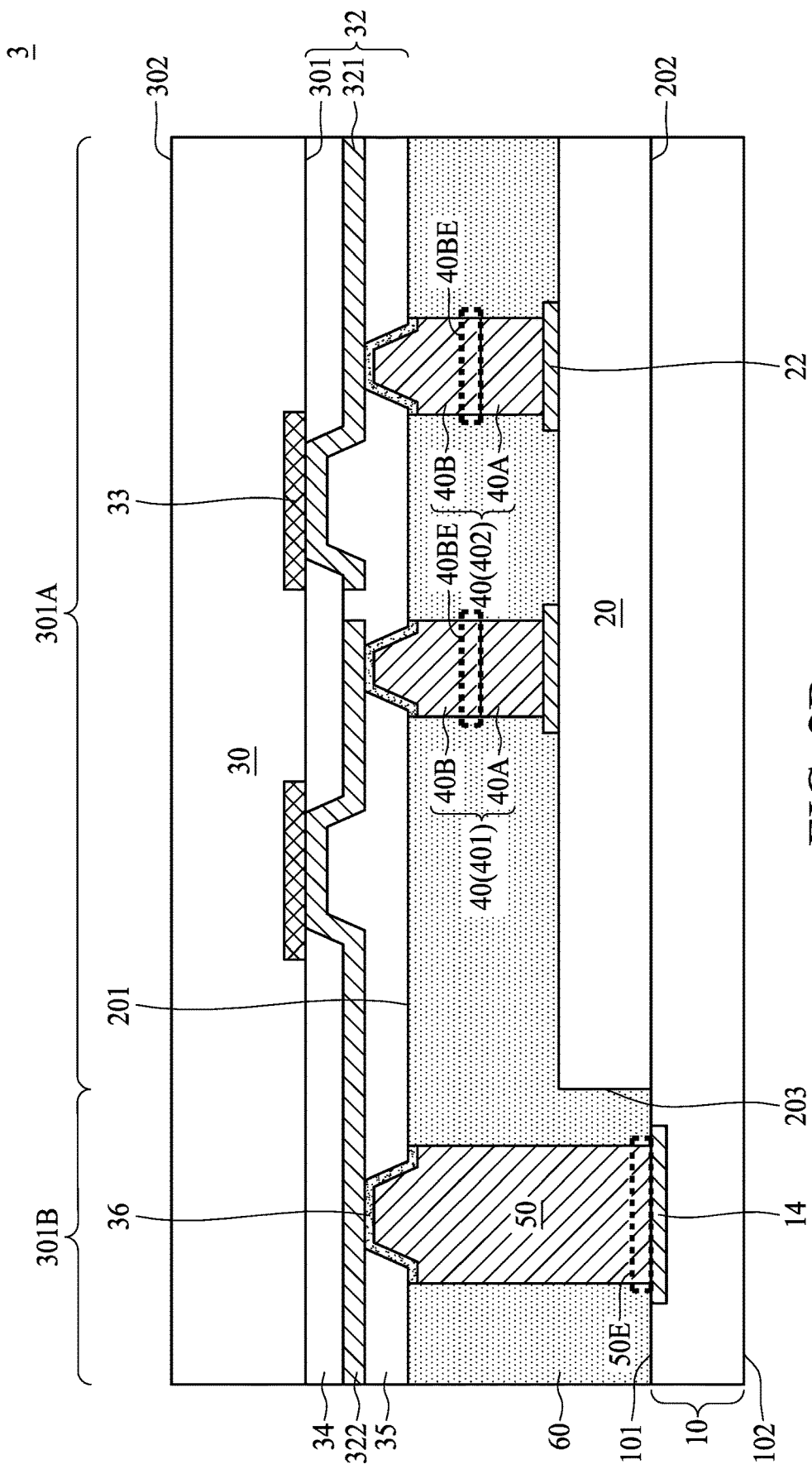
FIG. 2B is a cross-sectional view of an electronic device package in accordance with some embodiments of the present disclosure.

FIG. 2B is a cross-sectional view of an electronic device package 3 in accordance with some embodiments of the present disclosure. As shown in FIG. 2B, in contrast to the electronic device package 1 in FIG. 1, the encapsulation layer 60 may expose the first inactive surface 202 of the first semiconductor die 20, and the first inactive surface 202 may be in contact with the first surface 101 of the circuit layer 10. Accordingly, heat dissipation efficiency may be improved and overall height of the electronic device package 3 may be reduced. In some embodiments, each of the first conductive structures may include a stack of a first conductive material 40A adjacent to the first semiconductor die 20 and a second conductive material 40B adjacent to the second semiconductor die 30. The first conductive material 40A and the second conductive material 40B may each include a conductive pillar or a conductive stud, and form a solder-free joint, which can improve electrical performance. In some embodiments, the second conductive material 40B includes a first end 40BE toward the circuit layer 10. In some embodiments, the second conductive structure 50 may include a conductive pillar. The second conductive structure 50 includes a second end 50E toward the circuit layer 10. The first end 40BE and the second end 50E are not leveled, e.g., the first end 40BE and the second end 50E are not disposed at the same horizontal level. By way of example, the second end 50E is lower than the first end 40BE, e.g., the second end 50E is closer to the circuit layer 10 than the first end 40BE.

Figure 2C:
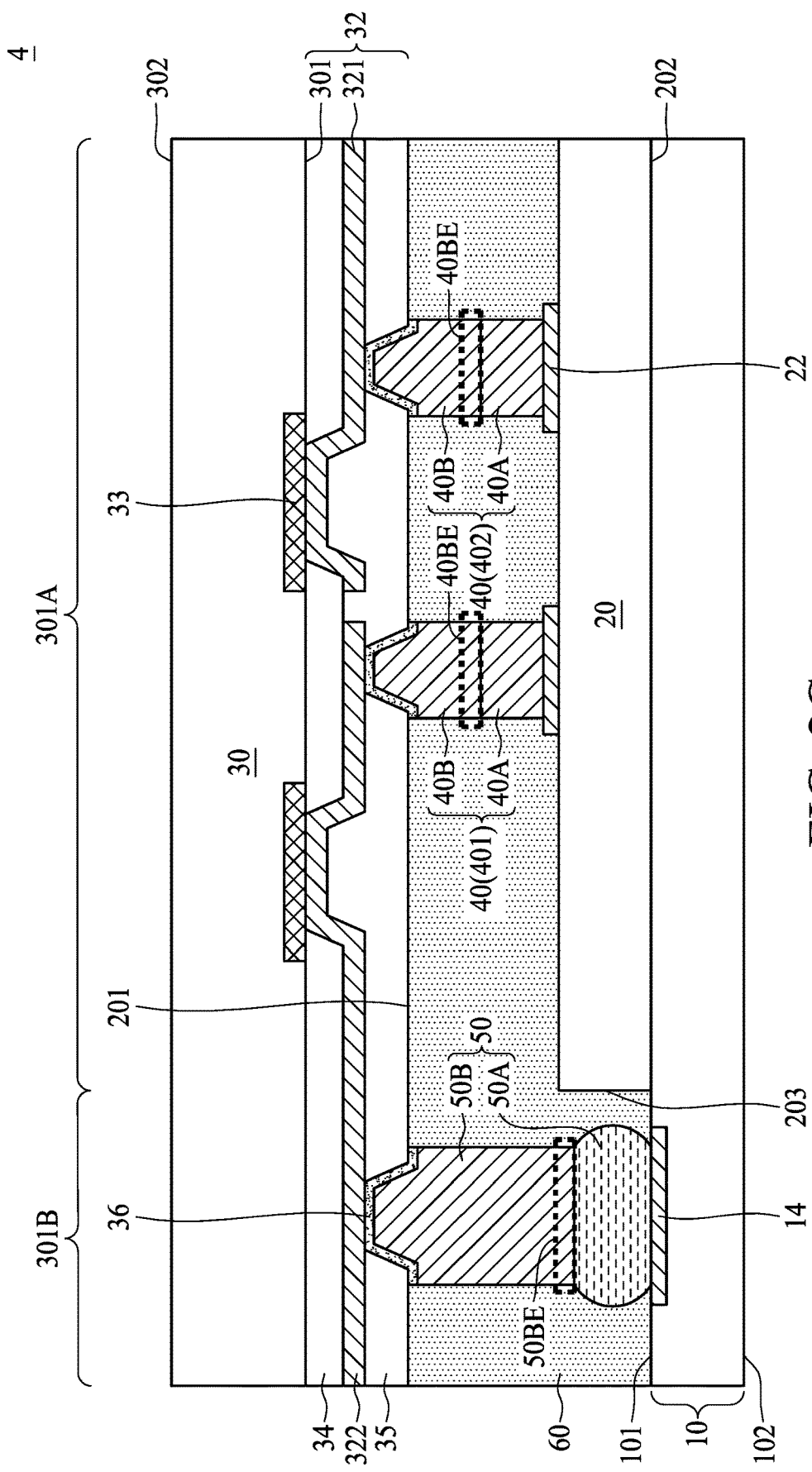
FIG. 2C is a cross-sectional view of an electronic device package in accordance with some embodiments of the present disclosure.

FIG. 2C is a cross-sectional view of an electronic device package 4 in accordance with some embodiments of the present disclosure. As shown in FIG. 2C, in contrast to the electronic device package 3 in FIG. 2B, each of the second conductive structures 50 may include a stack of a first conductive material 50A adjacent to the circuit layer 10 and a second conductive material 50B adjacent to the second semiconductor die 30. In some embodiments, the second conductive material 50B may include a conductive pillar pre-formed on the seed layer 36, and bonded to the conductive wiring layers 14 of the circuit layer 10 with the first conductive material 50A such as a conductive solder. The second conductive material 50B of the second conductive structure 50 includes a second end 50BE toward the circuit layer 10. The first end 40BE and the second end 50BE are not leveled, e.g., the first end 40BE and the second end 50BE are not disposed at the same horizontal level. By way of example, the second end 50BE is lower than the first end 40BE, e.g., the second end 50E is closer to the circuit layer 10 than the first end 40BE

Figure 3:
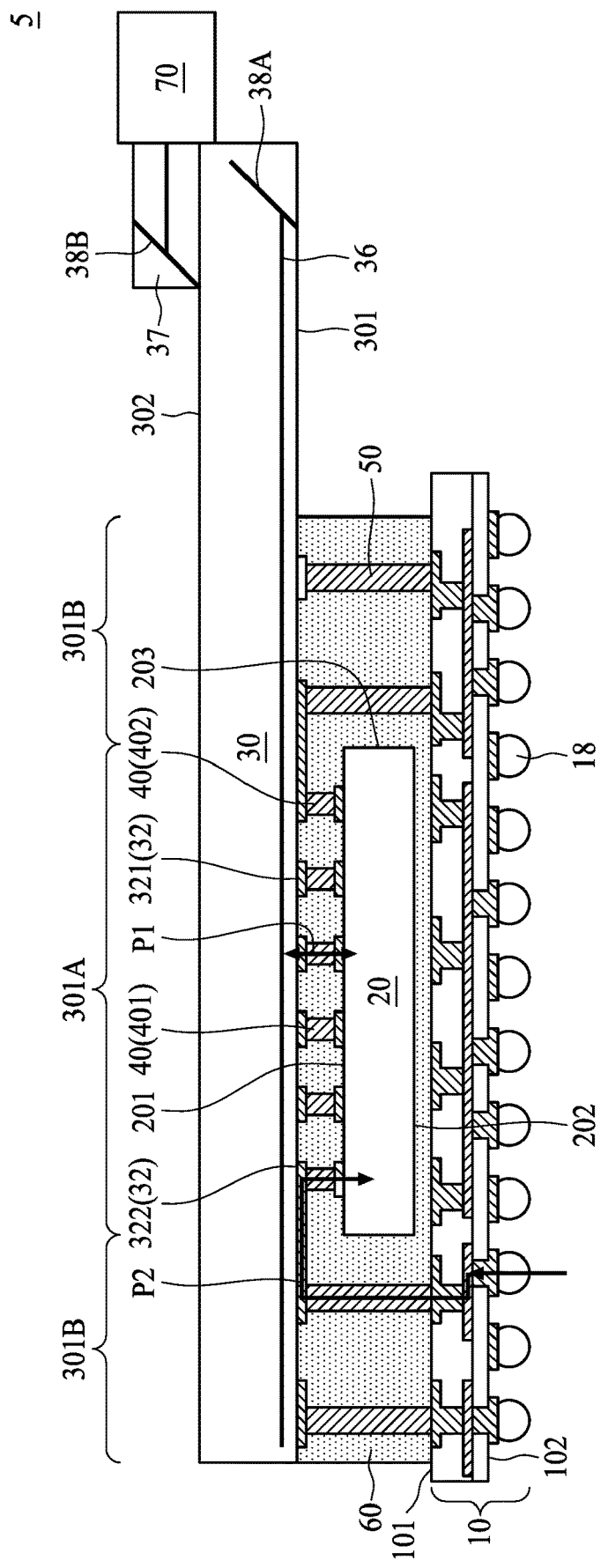
FIG. 3 is a cross-sectional view of an electronic device package in accordance with some embodiments of the present disclosure.

FIG. 3 is a cross-sectional view of an electronic device package 5 in accordance with some embodiments of the present disclosure. As shown in FIG. 3, the second semiconductor die 30 of the electronic device package 5 can be a PIC having a waveguide layer 36, for example, disposed in proximity to the active surface 301. In some embodiments, the waveguide layer 36 may possess a greater refractive index than that of a cladding layer (not shown) surrounding the waveguide layer 36. For example, the waveguide layer 36 may include a plurality of waveguides, or optical channels. Each of the optical channels has a center wavelength (e.g., 1.48 μm, 1.52 μm, 1.55 μm, etc.), and each optical channel is typically assigned a minimum channel spacing or bandwidth to avoid crosstalk with other optical channels.

The electronic device package 4 may further include an optical fiber 70 optically coupled to the waveguide layer 36 of second semiconductor die 30 through, for example, a pair of reflectors 38A, 38B, and a coupler 37. As shown in FIG. 3, the optical fiber 70 is disposed over the second inactive surface 302 of the second semiconductor die 30. Reflector 38A can be machined in the body of the second semiconductor die 30 by a MEMS procedure so as to alter the optical path from a horizontal direction to a vertical direction, for example. The optical path is then altered again at the reflector 38B machined in the coupler 37 from a vertical direction to a horizontal direction, and subsequently propagating into the optical fiber 70. To reduce optical loss, boundaries between the second inactive surface 302 of the second semiconductor die 30 and the coupler 70 may father include a layer of anti-reflective coating (ARC) (not shown). In some other embodiments, the coupler 70 may be disposed adjacent to an edge of the semiconductor die 30 and aligned to the waveguide layer 36.

Figure 4A:
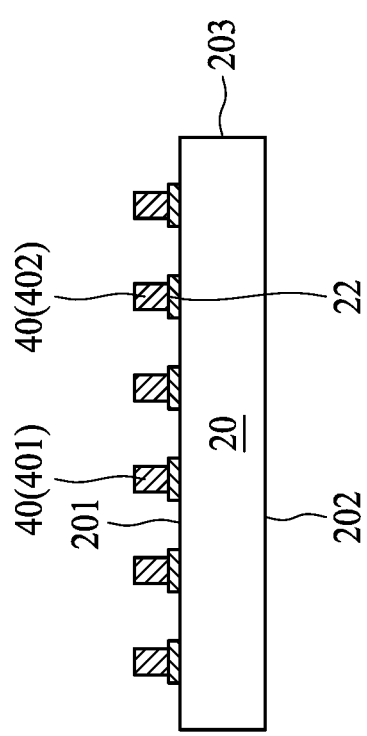
FIG. 4A, FIG. 4B, FIG. 4C, FIG. 4D and FIG. 4E illustrate operations of manufacturing an electronic device package in accordance with some embodiments of the present disclosure.
Figure 4B:
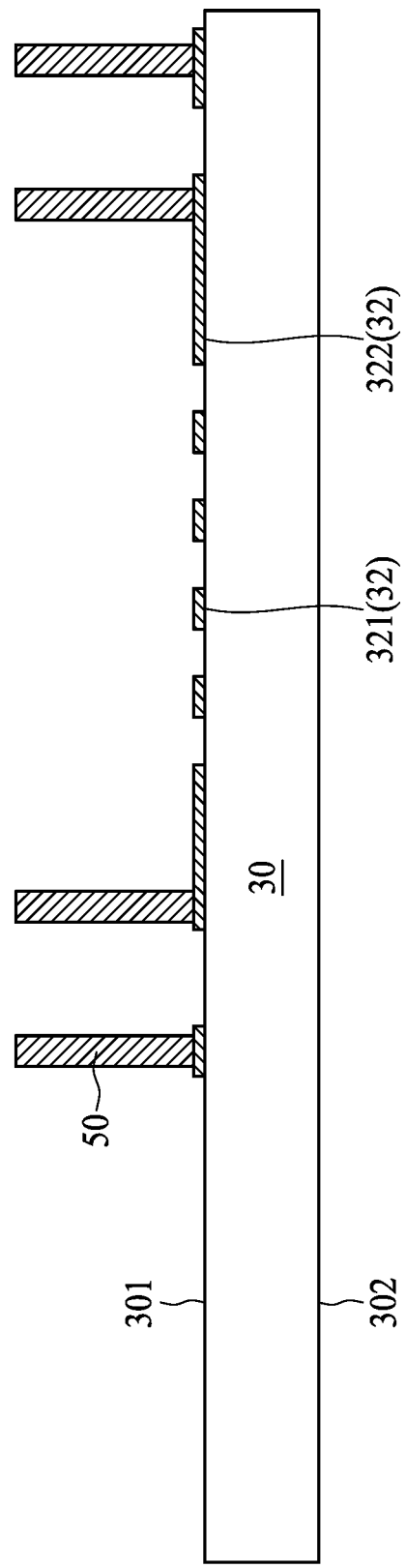
Figure 4C:
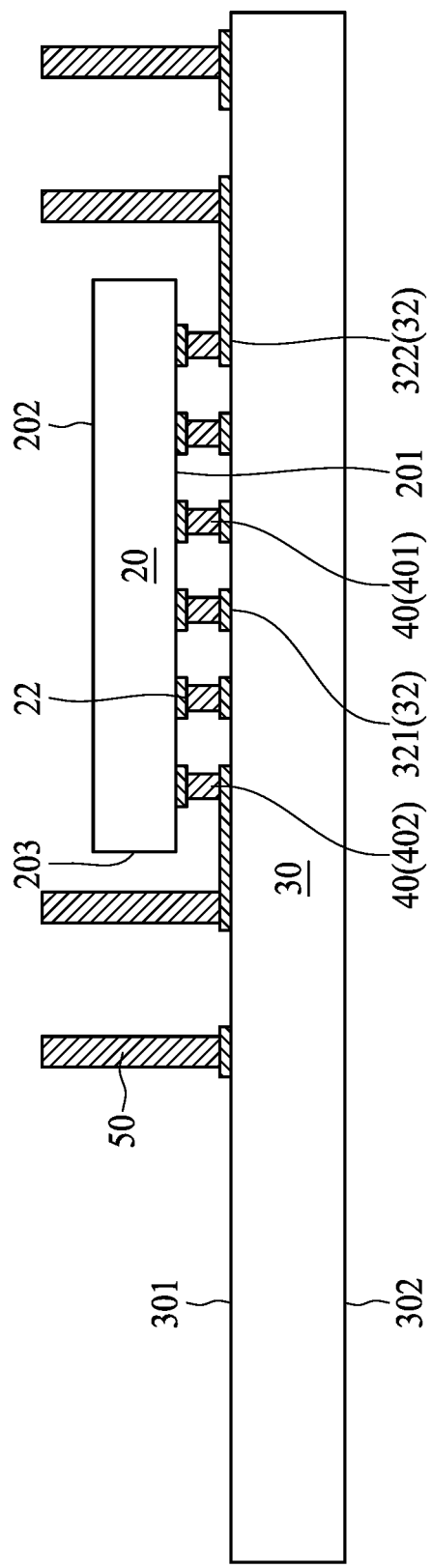
Figure 4D:
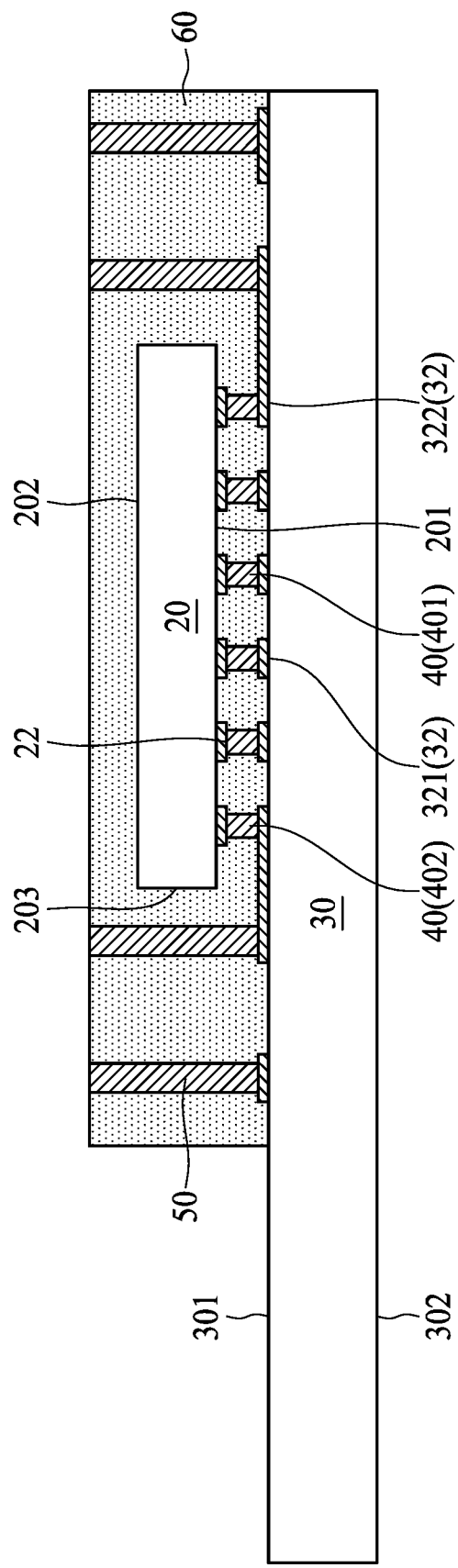
Figure 4E:
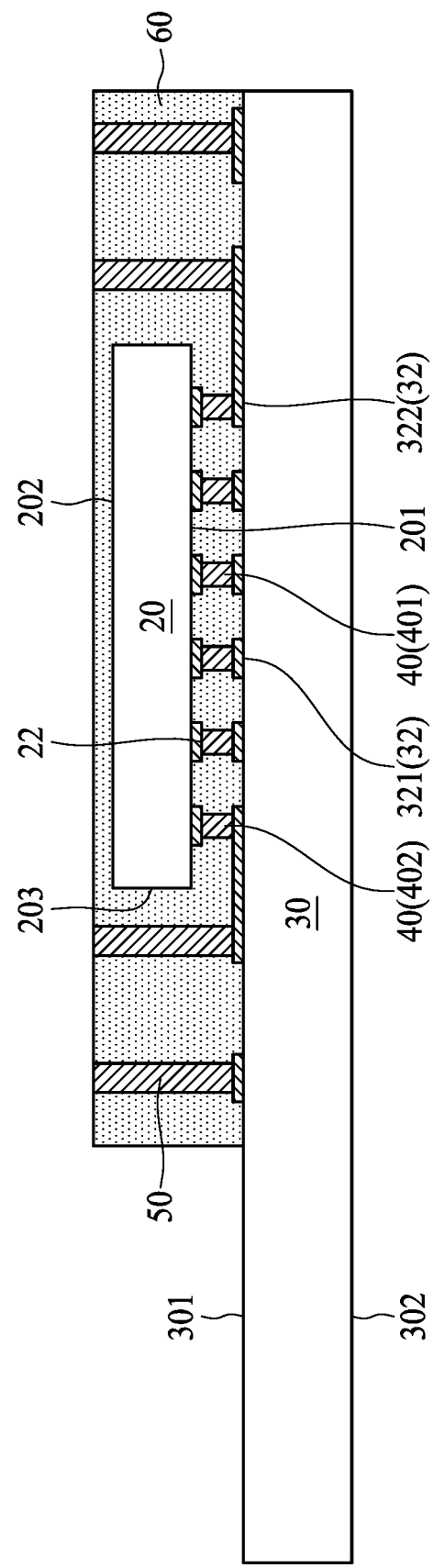

FIG. 4A, FIG. 4B, FIG. 4C, FIG. 4D and FIG. 4E illustrate operations of manufacturing an electronic device package in accordance with some embodiments of the present disclosure. As shown in FIG. 4A, a first semiconductor die 20 is provided. The first semiconductor die 20 may include electrical terminals 22 such as bonding pads exposed from the first active surface 201. As shown in FIG. 4B, a plurality of second conductive structures 50 are formed on the second active surface 302 of the second semiconductor die 30. As shown in FIG. 4C, a second semiconductor die 30 with a redistribution trace layer 32 exposed from an active surface 301 of the second semiconductor die 30 is provided. The first semiconductor die 20 is bonded to a portion of the redistribution trace layer 32 of the second semiconductor die 30 with a plurality of first conductive structures 40. For example, the first semiconductor die 20 may be die-to-die bonded to the redistribution trace layer 32 of the second semiconductor die 30. As shown in FIG. 4D, an encapsulation layer 60 is formed on the second active surface 301 of the second semiconductor die 30 to encapsulate the first semiconductor die 20. As shown in FIG. 4E, the encapsulation layer 60 may be optionally grinded to expose a first inactive surface 202 of the semiconductor die 20. A circuit layer 10 is then formed on the encapsulation layer 60 to electrically connect the second semiconductor die 30 with the second conductive structures 50 to form the electronic device package as illustrated in FIG. 1, FIG. 2A, FIG. 2B, FIG. 2C or FIG. 3.

In some embodiments of the present disclosure, the electronic device package including three electronic components such as a circuit layer, an EIC and a PIC stacked on one another. The smaller electronic component such as the EIC is interposed between the larger electronic components such as the circuit layer and the PIC. Shorter conductive structures are utilized to interconnect the PIC and the EIC, and taller conductive structures are utilized to interconnect the circuit layer and the PIC. The conductive structures are lower in resistance compared to bonding wires, and the conductive structures can shorten the transmission path among the circuit layer, the EIC and the PIC. Accordingly, induction effect and signal integrity issue can be alleviated.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic device package, comprising:
   a circuit layer;
   an encapsulation layer disposed on the circuit layer;
   a first semiconductor die disposed on the circuit layer, wherein the first semiconductor die comprises an electronic Integrated Circuit (IC), and wherein the first semiconductor die is encapsulated by the encapsulation layer; and
   a second semiconductor die disposed on the first semiconductor die and the encapsulation layer, wherein the second semiconductor die comprises a photonic IC, and wherein a side of the second semiconductor die protrudes from a side of the encapsulation layer,
   wherein the second semiconductor die further comprises another side opposite to the side of the second semiconductor die, and the encapsulation layer further comprises another side opposite to the side of the encapsulation layer, wherein the another side of the second semiconductor die is substantially aligned with or substantially coplanar with the another side of the encapsulation layer.

2. The electronic device package of claim 1, wherein the circuit layer further comprises a first surface facing the first semiconductor die, wherein a portion of the first surface of the circuit layer is exposed from the encapsulation layer beyond the side of the encapsulation layer.

3. The electronic device package of claim 1, wherein a side of the circuit layer protrudes from the side of the encapsulation layer.

4. The electronic device package of claim 1, wherein the side of the encapsulation layer connects the circuit layer to the second semiconductor die.

5. The electronic device package of claim 4, wherein the another side of the second semiconductor die is further supported by the another side of the encapsulation layer.

6. The electronic device package of claim 1, wherein the side of the encapsulation layer is between the circuit layer and the second semiconductor die.

7. The electronic device package of claim 1, wherein the encapsulation layer is disposed on a first surface of the circuit layer, and a portion of the first surface of the circuit layer faces a bottom surface of the second semiconductor die.

8. The electronic device package of claim 7, wherein a space between the portion of the first surface of the circuit layer and the side of the second semiconductor die is absent the encapsulation layer.

9. An electronic device package, comprising:
   a circuit layer;
   a photonic component disposed over the circuit layer; and
   an encapsulation layer disposed between the photonic component and the circuit layer, wherein a side of the photonic component protrudes from an extension plane of a side of the encapsulation layer, the extension plane being coincident and parallel to the side of the encapsulation layer,
   wherein a side of the circuit layer protrudes from the extension plane of the side of the encapsulation layer, wherein the side of the circuit layer protrudes by a first distance from the extension plane of the side of the encapsulation layer, the side of the photonic component protrudes by a second distance from the extension plane of the side of the encapsulation layer, and the second distance is greater than the first distance.

10. The electronic device package of claim 9, further comprising an electronic die encapsulated by the encapsulation layer.

11. The electronic device package of claim 10, further comprising a redistribution trace layer disposed between the electronic die and the photonic component.

12. An electronic device package, comprising:
a circuit layer;
a photonic component disposed over the circuit layer; and
an encapsulation layer disposed between the photonic component and the circuit layer,
wherein a side of the photonic component protrudes from an extension plane of a side of the encapsulation layer, the extension plane being coincident and parallel to the side of the encapsulation layer;
wherein the photonic component further comprises another side opposite to the side of the photonic component and the encapsulation layer further comprises another side opposite to the side of the encapsulation layer, wherein the another side of the photonic component is substantially aligned with or substantially coplanar with the another side of the encapsulation layer.

13. An electronic device package, comprising:
an encapsulation layer;
a photonic component disposed on the encapsulation layer, wherein the photonic component further comprises a first region overlapping the encapsulation layer from a cross sectional perspective and a second region overhanging the encapsulation layer from the cross sectional perspective; and
an electronic component disposed in the encapsulation layer and configured to modulate an optical light propagating in the photonic component,
wherein the photonic component further comprises an active surface facing the encapsulation layer, wherein the photonic component further comprises an optical path within the second region wherein the optical path is extended between the active surface of the photonic component and a second surface of the photonic component opposite to the active surface.

14. The electronic device package of claim 13, further comprising an optical device disposed adjacent to the second region, wherein the electronic component is configured to be electrically connected through the first region.

15. The electronic device package of claim 13, further comprising an optical device disposed on the second surface of the photonic component.

16. The electronic device package of claim 13, further comprising a circuit layer disposed below the encapsulation layer, wherein the second region overhangs the circuit layer from the cross sectional perspective.

* * * * *